United States Patent
Zhu et al.

(10) Patent No.: US 11,616,278 B2
(45) Date of Patent: Mar. 28, 2023

(54) RF PHASE SHIFTER COMPRISING A PLURALITY OF SECTIONS THAT INCLUDE FIRST AND SECOND TRANSMISSION LINES COUPLED TO MIXERS CONFIGURED TO OUTPUT SIGNALS WITH CHANGEABLE PHASE GRADIENTS RESPONSIVE TO SIGNALS OF DIFFERENT FREQUENCIES

(71) Applicants: TIME VARYING TRANSMISSION CO., LTD, Xiangtan (CN); AXEND, INC., Los Angeles, CA (US)

(72) Inventors: Rui Zhu, Xiangtan (CN); Qiang Xu, Xiangtan (CN); Yougang Fang, Xiangtan (CN); Yaozhong Liu, Los Angeles, CA (US); Gengye Liu, Xiangtan (CN); Yuexing Li, Los Angeles, CA (US)

(73) Assignees: TIME VARYING TRANSMISSION CO., LTD., Hunan (CN); AXEND, INC., Los Angeles, CA (US)

( * ) Notice: Subject to any disclaimer, the term of this patent is extended or adjusted under 35 U.S.C. 154(b) by 0 days.

(21) Appl. No.: 17/287,165

(22) PCT Filed: Jan. 17, 2019

(86) PCT No.: PCT/CN2019/072091
§ 371 (c)(1),
(2) Date: Apr. 21, 2021

(87) PCT Pub. No.: WO2020/082627
PCT Pub. Date: Apr. 30, 2020

(65) Prior Publication Data
US 2021/0376433 A1    Dec. 2, 2021

(30) Foreign Application Priority Data

Oct. 25, 2018  (CN) .......................... 201811251356.7

(51) Int. Cl.
*H01P 1/18*   (2006.01)
*H03H 11/20*  (2006.01)
*H01P 9/00*   (2006.01)

(52) U.S. Cl.
CPC .................. *H01P 1/18* (2013.01); *H01P 9/00* (2013.01); *H03H 11/20* (2013.01)

(58) Field of Classification Search
CPC .............. H01P 1/18; H01P 9/00; H03H 11/20
(Continued)

(56) References Cited

U.S. PATENT DOCUMENTS

2008/0180324 A1    7/2008  Floyd et al.

FOREIGN PATENT DOCUMENTS

CN    101189758 A    5/2008
CN    101582527 A    11/2009
(Continued)

OTHER PUBLICATIONS

Supplementary Search of Chinese Prior Application in connection to Application No. 2018112513567. Document 1.
(Continued)

*Primary Examiner* — Benny T Lee
(74) *Attorney, Agent, or Firm* — Carter, DeLuca & Farrell LLP; George Likourezos

(57) ABSTRACT

Provided is a radio frequency phase shifter. The radio frequency phase shifter includes multiple sections of first transmission lines, multiple sections of second transmission lines, multiple mixers, and multiple couplers. Multiple sections of first transmission lines are sequentially connected to form a bus transmission line. Multiple sections of second transmission lines are sequentially connected to form another bus transmission line. Moreover, multiple sections of first transmission lines have a one-to-one correspondence with multiple sections of second transmission lines. One
(Continued)

coupler is connected between two adjacent sections of first transmission lines. One coupler is connected between two adjacent sections of second transmission lines. One mixer is connected between the two corresponding couplers. In the case where two input signals with different frequencies are transmitted on two bus transmission lines respectively, the multiple mixers arranged in sequence output a group of signals with a phase gradient.

9 Claims, 7 Drawing Sheets

(58) Field of Classification Search
USPC .......................................................... 333/156
See application file for complete search history.

(56) References Cited

FOREIGN PATENT DOCUMENTS

| | | |
|---|---|---|
| JP | 2009141737 A | 6/2009 |
| JP | 2009231904 A | 10/2009 |
| WO | 2017218396 A1 | 12/2017 |

OTHER PUBLICATIONS

Second Office Action received from the State Intellectual Property Office of People's Republic of China in connection to Chinese Application No. 201811251356.7 (Translation).
Second Office Action received from the State Intellectual Property Office of People's Republic of China in connection to Chinese Application No. 201811251356.7 (Original).
First Office Action received from the State Intellectual Property Office of People's Republic of China in connection to Chinese Application No. 201811251356.7 (Translated).
First Office Action received from the State Intellectual Property Office of People's Republic of China in connection to Chinese Application No. 201811251356.7 (Original).
International Search Report issued by the China National Intellectual Property Administration (ISA/CN) in connection to International Application No. PCT/CN2019/072091 dated Jul. 24, 2019.
First Search of Chinese prior Applciation No. 2018112513567.
Supplementary Search of Chinese Prior Application in connection to Application No. 2018112513567. Document 2.
European Search Report issued by the European Patent Office in connection with International Application No. 19875550.6, dated Jul. 12, 2022.
Leung Chiu, et al., "Investigation of a Wideband 90 Hybrid Coupler With an Arbitrary Coupling Level", IEEE Transactions of Microwave Theory and Techniques, vol. 58, No. 4, Apr. 2010.

RF PHASE SHIFTER COMPRISING A PLURALITY OF SECTIONS THAT INCLUDE FIRST AND SECOND TRANSMISSION LINES COUPLED TO MIXERS CONFIGURED TO OUTPUT SIGNALS WITH CHANGEABLE PHASE GRADIENTS RESPONSIVE TO SIGNALS OF DIFFERENT FREQUENCIES

This is a national stage application, filed under 35 U.S.C. 371, of International Patent Application NO. PCT/CN2019/072091, filed on Jan. 17, 2019, which is based on and claims priority to Chinese Patent Application No. 201811251356.7, entitled "RADIO FREQUENCY PHASE SHIFTER" and filed Oct. 25, 2018 with CNIPA, the disclosure of which is incorporated herein by reference in its entirety.

TECHNICAL FIELD

The present disclosure relates to the field of phased array and in particular, to a radio frequency phase shifter.

BACKGROUND

The next generation of 5G mobile communication will bring a data rate of tens or even hundreds of Gbps, far exceeding the data rates of current and previous communication systems. To achieve this goal, 5G not only uses broadband spectrum resources in multiple frequency bands such as millimeter-wave frequency band but also uses a large-scale antenna array to further increase the channel capacity through the spatial diversity of electromagnetic wave transmission.

In a phased array, to achieve beamforming, it is necessary to control the phase of each antenna unit, which is usually achieved by adding an analog phase shifter. The analog phase shifter directly changes the phase of the radio frequency signal on the radio frequency channel. In a large-scale antenna array, each antenna needs a set of phase shifters for controlling the corresponding phase. In this manner, the entire antenna system has a complex structure and high cost, and it is difficult to control the entire antenna system.

SUMMARY OF THE INVENTION

The present disclosure provides a radio frequency phase shifter. With a simple structure, the radio frequency phase shifter can achieve phase control of a phased array.

The present disclosure provides a radio frequency phase shifter. The radio frequency phase shifter includes multiple sections of first transmission lines, multiple sections of the second transmission lines, multiple mixers, and multiple couplers.

The multiple sections of first transmission lines are sequentially connected to form a bus transmission line. The multiple sections of second transmission lines are sequentially connected to form another bus transmission line. Moreover, the multiple sections of first transmission lines have a one-to-one correspondence with the multiple sections of second transmission lines.

One of the multiple couplers is connected between the two adjacent sections of the multiple sections of first transmission lines. One of the multiple couplers is connected between two the adjacent sections of the multiple sections of second transmission lines. One of the multiple mixers is connected between the two respective ones of the multiple couplers.

In the case where two input signals with different frequencies are transmitted on the two bus transmission lines respectively, the multiple mixers output a group of signals with a phase gradient.

Alternatively, if the multiple couplers do not have a phase delay, in the case where two input signals with different frequencies are transmitted in reverse directions on the two bus transmission lines respectively, and the frequency of the output signal of each mixer is a difference frequency component, the phase gradient is described below.

$$\Delta\phi = \frac{\Delta\omega}{v_p} \cdot (\Delta l_s + \Delta l_p)$$

In the equation, $\Delta\omega$ denotes a frequency offset, $\Delta l_s$ and $\Delta l_p$ denote the length of the first transmission line and the length of the second transmission line, respectively, and $v_p$ denotes the phase velocity of two input signals in the transmission line.

The frequencies of the two input signals satisfy the conditions described below.

$$\omega_s = \omega_{s0} + \Delta\omega$$
$$\omega_p = \omega_{p0} + \Delta\omega$$
$$\omega_{p0} - \omega_{s0} = \omega_{RF}$$
$$\frac{(\omega_{p0}\Delta l_p + \omega_{s0}\Delta l_s)}{v_p} = 2\pi \cdot m$$

In the equation, $\omega_p$ and $\omega_s$ denote the frequencies of two input signals, respectively, $\omega_{p0}$ and $\omega_{s0}$ denote two preset frequencies, $\Delta\omega$ denotes a frequency offset, and $\omega_{RF}$ denotes the frequency of the output signal.

Alternatively, if the multiple couplers do not have a phase delay, in the case where two input signals with different frequencies are transmitted in reverse directions on the two bus transmission lines, respectively, and the frequency of the output signal of each mixer is a sum frequency component, the phase gradient is described below.

$$\Delta\phi = \frac{\Delta\omega}{v_p} \cdot (\Delta l_s + \Delta l_p)$$

In the equation, $\Delta\omega$ denotes a frequency offset, $\Delta l_s$ and $\Delta l_p$ denote the length of the first transmission line and the length of the second transmission line, respectively, and $v_p$ denotes the phase velocity of two input signals in the transmission line.

The frequencies of the two input signals satisfy the conditions described below.

$$\omega_s = \omega_{s0} - \Delta\omega$$
$$\omega_p = \omega_{p0} + \Delta\omega$$
$$\omega_{p0} + \omega_{s0} = \omega_{RF}$$
$$\frac{(\omega_p \Delta l_p - \omega_{s0}\Delta l_s)}{v_p} = 2\pi \cdot m$$

In the equation, $\omega_p$ and $\omega_s$ denote the frequencies of two input signals, respectively, $\omega_{p0}$ and $\omega_{s0}$ denote two preset frequencies, $\Delta\omega$ denotes a frequency offset, and $\omega_{RF}$ denotes the frequency of the output signal.

Alternatively, if the multiple couplers do not have a phase delay, in the case where two input signals with different frequencies are transmitted in the same direction on the two bus transmission lines respectively, and the frequency of the output signal of each mixer is a difference frequency component, the phase gradient is described below.

$$\Delta\phi = \frac{\Delta\omega}{v_p} \cdot (\Delta l_s - \Delta l_p)$$

In the equation, $\Delta\omega$ denotes a frequency offset, $\Delta l_s$ and $\Delta l_p$ denote the length of the first transmission line and the length of the second transmission line, respectively, and $v_p$ denotes the phase velocity of two input signals in the transmission line.

The frequencies of the two input signals satisfy the conditions described below.

$$\omega_s = \omega_{s0} + \Delta\omega$$
$$\omega_p = \omega_{p0} + \Delta\omega$$
$$\omega_{p0} - \omega_{s0} = \omega_{RF}$$
$$-\frac{(\omega_{p0}\Delta l_p - \omega_{s0}\Delta l_s)}{v_p} = 2\pi \cdot m$$

In the equation, $\omega_p$ and $\omega_s$ denote the frequencies of two input signals, respectively, $\omega_{p0}$ and $\omega_{s0}$ denote two preset frequencies, Ace denotes a frequency offset, and $\omega_{RF}$ denotes the frequency of the output signal.

Alternatively, if the multiple couplers do not have a phase delay, in the case where two input signals with different frequencies are transmitted in the same direction on the two bus transmission lines respectively, and the frequency of the output signal of each mixer is a sum frequency component, the phase gradient is described below.

$$\Delta\phi = \frac{\Delta\omega}{v_p} \cdot (\Delta l_s - \Delta l_p)$$

In the equation, $\Delta\omega$ denotes a frequency offset, $\Delta l_s$ and $\Delta l_p$ denote the length of the first transmission line and the length of the second transmission line, respectively, and $v_p$ denotes the phase velocity of two input signals in the transmission line.

The frequencies of the two input signals satisfy the conditions described below.

$$\omega_s = \omega_{s0} - \Delta\omega$$
$$\omega_p = \omega_{p0} + \Delta\omega$$
$$\omega_{p0} + \omega_{s0} = \omega_{RF}$$
$$-\frac{(\omega_{p0}\Delta l_p + \omega_{s0}\Delta l_s)}{v_p} = 2\pi \cdot m$$

In the equations, $\omega_p$ and $\omega_s$ denote the frequencies of two input signals respectively, $\omega_{p0}$ and $\omega_{s0}$ denote two preset frequencies, $\Delta\omega$ denotes a frequency offset, and $\omega_{RF}$ denotes the frequency of the output signal.

Alternatively, if the multiple couplers have a phase delay, in the case where two input signals with different frequencies are transmitted in reverse directions on the two bus transmission lines respectively, and the frequency of the output signal of each mixer is a difference frequency component, the phase gradient is described below.

$$\Delta\phi = \Delta\omega \cdot \left(\frac{L_s}{v_s^d} + \frac{\Delta l_s}{v_p} + \frac{L_p}{v_p^d} + \frac{\Delta l_p}{v_p}\right)$$

In the equation, $\Delta\omega$ denotes a frequency offset, $\Delta l_s$ and $\Delta l_p$ denote the length of the first transmission line and the length of the second transmission line respectively, $v_p$ denotes the phase velocity of two input signals in the transmission line, $L_s$ denotes the equivalent length of the coupler connected to the first transmission line, $L_p$ denotes the equivalent length of the coupler connected to the second transmission line, $v_s^d$ denotes the equivalent phase velocity of the input signal in the coupler connected to the first transmission line, and $v_p^d$ denotes the equivalent phase velocity of the input signal in the coupler connected to the second transmission line.

The frequencies of the two input signals satisfy the conditions described below.

$$\omega_s = \omega_{s0} + \Delta\omega$$
$$\omega_p = \omega_{p0} + \Delta\omega$$
$$\omega_{p0} - \omega_{s0} = \omega_{RF}$$
$$\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) + \theta_s^d + \theta_p^d = 2\pi \cdot m$$

In the equations, $\omega_p$ and $\omega_s$ denote the frequencies of two input signals respectively, $\omega_{p0}$ and $\omega_{s0}$ denote two preset frequencies, $\Delta\omega$ denotes a frequency offset, $\omega_{RF}$ denotes the frequency of the output signal, $\theta_s^d$ denotes the phase delay of the through port of the coupler connected to the first transmission line, and $\theta_p^d$ denotes the phase delay of the through port of the coupler connected to the second transmission line.

Alternatively, if the multiple couplers have a phase delay, in the case where two input signals with different frequencies are transmitted in reverse directions on the two bus transmission lines respectively, and the frequency of the output signal of each mixer is a sum frequency component, the phase gradient is described below.

$$\Delta\phi = \Delta\omega \cdot \left(\frac{L_s}{v_s^d} + \frac{\Delta l_s}{v_p} + \frac{L_p}{v_p^d} + \frac{\Delta l_p}{v_p}\right)$$

In the equation, $\Delta\omega$ denotes a frequency offset, $\Delta l_s$ and $\Delta l_p$ denote the length of the first transmission line and the length of the second transmission line respectively, $v_p$ denotes the phase velocity of two input signals in the transmission line, $L_s$ denotes the equivalent length of the coupler connected to the first transmission line, $L_p$ denotes the equivalent length of the coupler connected to the second transmission line, $v_s^d$ denotes the equivalent phase velocity of the input signal in the coupler connected to the first transmission line, and $v_p^d$ denotes the equivalent phase velocity of the input signal in the coupler connected to the second transmission line.

The frequencies of the two input signals satisfy the conditions described below.

$$\omega_s = \omega_{s0} - \Delta\omega$$

$$\omega_p = \omega_{p0} + \Delta\omega$$

$$\omega_{p0} + \omega_{s0} = \omega_{RF}$$

$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

In the equation, $\omega_p$ and $\omega_s$ denote the frequencies of two input signals respectively, $\omega_{p0}$ and $\omega_{s0}$ denote two preset frequencies, $\Delta\omega$ denotes a frequency offset, $\omega_{RF}$ denotes the frequency of the output signal, $\theta_s^d$ denotes the phase delay of the through port of the coupler connected to the first transmission line, and $\theta_p^d$ denotes the phase delay of the through port of the coupler connected to the second transmission line.

Alternatively, if the multiple couplers have a phase delay, in the case where two input signals with different frequencies are transmitted in the same direction on the two bus transmission lines respectively, and the frequency of the output signal of each mixer is a difference frequency component, the phase gradient is described below.

$$\Delta\phi = \Delta\omega \cdot \left(\frac{L_s}{v_s^d} + \frac{\Delta l_s}{v_p} - \frac{L_p}{v_p^d} - \frac{\Delta l_p}{v_p}\right)$$

In the equation, $\Delta\omega$ denotes a frequency offset, $\Delta l_s$ and $\Delta l_p$ denote the length of the first transmission line and the length of the second transmission line respectively, $v_p$ denotes the phase velocity of two input signals in the transmission line, $L_s$ denotes the equivalent length of the coupler connected to the first transmission line, $L_p$ denotes the equivalent length of the coupler connected to the second transmission line, $v_s^d$ denotes the equivalent phase velocity of the input signal in the coupler connected to the first transmission line, and $v_p^d$ denotes the equivalent phase velocity of the input signal in the coupler connected to the second transmission line.

The frequencies of the two input signals satisfy the conditions described below.

$$\omega_s = \omega_{s0} + \Delta\omega$$

$$\omega_p = \omega_{p0} + \Delta\omega$$

$$\omega_{p0} - \omega_{s0} = \omega_{RF}$$

$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

In the equations, $\omega_p$ and $\omega_s$ denote the frequencies of two input signals respectively, $\omega_{p0}$ and $\omega_{s0}$ denote two preset frequencies, $\Delta\omega$ denotes a frequency offset, $\omega_{RF}$ denotes the frequency of the output signal, $\theta_s^d$ denotes the phase delay of the through port of the coupler connected to the first transmission line, and $\theta_p^d$ denotes the phase delay of the through port of the coupler connected to the second transmission line.

Alternatively, if the multiple couplers have a phase delay, in the case where two input signals with different frequencies are transmitted in the same direction on the two bus transmission lines respectively, and the frequency of the output signal of each mixer is a sum frequency component, the phase gradient is described below.

$$\Delta\phi = \Delta\omega \cdot \left(\frac{L_s}{v_s^d} + \frac{\Delta l_s}{v_p} - \frac{L_p}{v_p^d} - \frac{\Delta l_p}{v_p}\right)$$

In the equation, $\Delta\omega$ denotes a frequency offset, $\Delta l_s$ and $\Delta l_p$ denote the length of the first transmission line and the length of the second transmission line respectively, $v_p$ denotes the phase velocity of two input signals in the transmission line, $L_s$ denotes the equivalent length of the coupler connected to the first transmission line, $L_p$ denotes the equivalent length of the coupler connected to the second transmission line, $v_s^d$ denotes the equivalent phase velocity of the input signal in the coupler connected to the first transmission line, and $v_p^d$ denotes the equivalent phase velocity of the input signal in the coupler connected to the second transmission line.

The frequencies of the two input signals satisfy the conditions described below.

$$\omega_s = \omega_{s0} - \Delta\omega$$

$$\omega_p = \omega_{p0} + \Delta\omega$$

$$\omega_{p0} + \omega_{s0} = \omega_{RF}$$

$$\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) + \theta_s^d + \theta_p^d = 2\pi \cdot m$$

In the equations, $\omega_p$ and $\omega_s$ denote the frequencies of two input signals respectively, $\omega_{p0}$ and $\omega_{s0}$ denote two preset frequencies, $\Delta\omega$ denotes a frequency offset, $\omega_{RF}$ denotes the frequency of the output signal, $\theta_s^d$ denotes the phase delay of the through port of the coupler connected to the first transmission line, and $\theta_p^d$ denotes the phase delay of the through port of the coupler connected to the second transmission line.

BRIEF DESCRIPTION OF THE DRAWINGS

To illustrate the technical solutions in embodiments of the present disclosure or the technical solutions in the existing art more clearly, drawings used in the description of the embodiments or the existing art will be briefly described below.

DETAILED DESCRIPTION OF THE INVENTION

An embodiment of the present disclosure provides a radio frequency phase shifter. With a simple structure, the radio frequency phase shifter can achieve phase control of a phased array.

To make the purposes, features, and advantages of the present disclosure more apparent and easier to understand, the technical solutions in the embodiments of the present disclosure will be described clearly and completely in conjunction with the drawings in the embodiments of the present disclosure. Apparently, the embodiments described below are a part of, but not all of the embodiments of the present disclosure.

Figure 1:
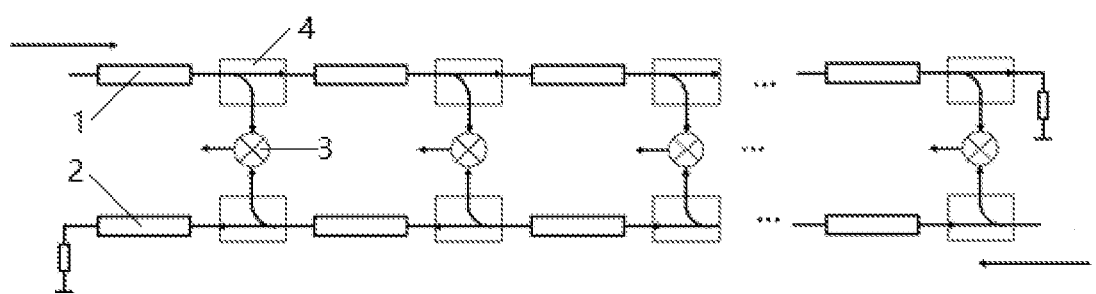
FIG. 1 is a structure diagram of a radio frequency phase shifter according to the present disclosure.

Referring to FIG. 1, in an embodiment of the present disclosure, a radio frequency phase shifter includes multiple sections of first transmission lines 1, multiple sections of second transmission lines 2, multiple mixers 3, and multiple couplers 4.

The multiple sections of first transmission lines 1 are sequentially connected to form a bus transmission line. The multiple sections of second transmission lines 2 are sequentially connected to form another bus transmission line. Moreover, the multiple sections of first transmission lines 1 have a one-to-one correspondence with the multiple sections of second transmission lines 2. It is to be noted that the one-to-one correspondence means that each section of first transmission line 1 in FIG. 1 corresponds to a respective section of second transmission line 2.

One coupler 4 is connected between two adjacent sections of first transmission lines 1. One coupler 4 is connected between two adjacent sections of second transmission lines 2. One mixer 3 is connected between two corresponding couplers 4. Therefore, multiple mixers 3 are connected in parallel between the two bus transmission lines, and each mixer is able to output a signal.

In the case where two input signals with different frequencies are transmitted on the two bus transmission lines respectively, the multiple mixers arranged as shown in FIG. 1 output a group of signals with a phase gradient. It is to be noted that each mixer 3 outputs a respective signal, and the phase difference between the signals output by the two adjacent mixers 3 is the phase gradient.

Based on the technical problems existing in the existing art, the inventor has found that electromagnetic waves with different frequencies produce different phase delays at the same transmission distance, and a phase difference may be formed at a node of a periodic transmission structure. Meanwhile, in the case where two electromagnetic waves with different frequencies are aliased, the phase of the new frequency component generated is related to the phase of the input signal. Therefore, a new type of phase shifter is designed in the present disclosure. Two input signals with different frequencies are input into two bus transmission lines respectively, and are aliased on the periodic node (mixer), so that a group of signals with the same frequency but with a phase gradient can be generated. Moreover, the phase gradient can be changed by changing the input frequency, thereby achieving the phase scanning function.

The working principle of the radio frequency phase shifter provided in the present disclosure will be specifically described in several specific application scenarios described below.

For ease of description, the first transmission line and the second transmission line are represented by the delay lines with the equivalent lengths of $\Delta l_s$ and $\Delta l_p$ respectively, the corresponding bus transmission lines are represented by an s line and a p line respectively, and the frequencies of the input signals on the s line and the p line are $\omega_s$ and $\omega_s$ respectively.

Figure 2:
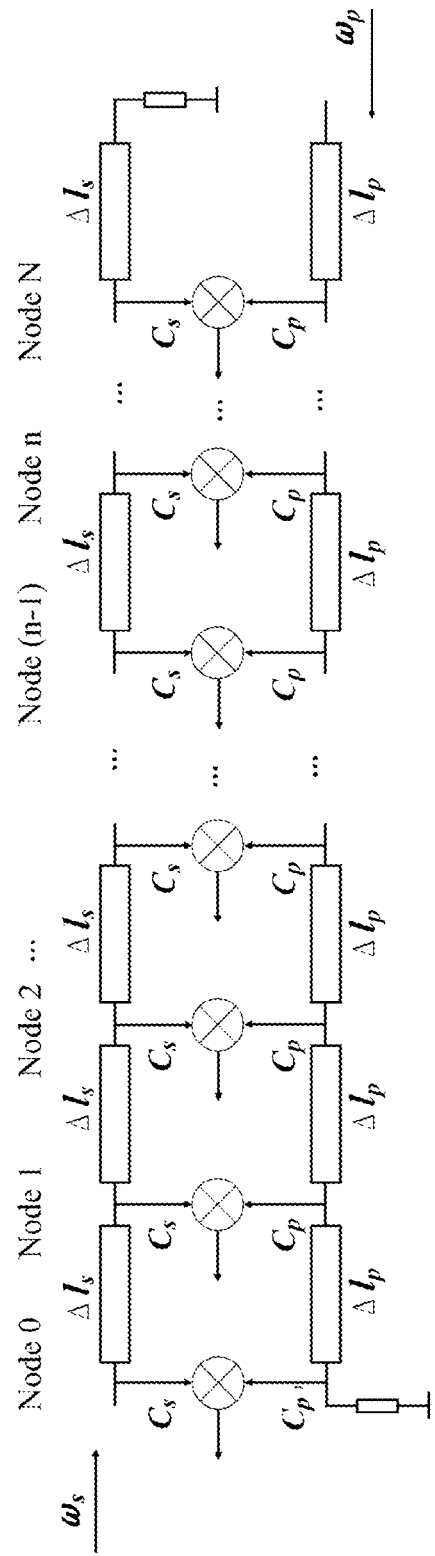
FIG. 2 is a structure diagram of application scenario (1) of the radio frequency phase shifter according to the present disclosure.

(1) First, in an application scenario (1), it is assumed that the couplers do not have a phase delay. In this case, the structure of the radio frequency phase shifter provided in the present disclosure may be equivalent to the structure shown in FIG. 2. Mixers are periodically connected between the s line and the p line, and the node where the n-th mixer is connected between the s line and the p line is Node n (hereinafter referred to as the n-th node), where n=0, 1, 2, ..., (n−1), n, N. In the application scenario (1), two input signals are transmitted in reverse directions (transmitted in opposite directions) without loss of generality. Assuming that $\omega_s$ is less than $\omega_s$, the coupling coefficients of the couplers are $C_s$ and $C_p$ (all set to be close to constants) respectively, and the output signal of the mixer retains a difference frequency component ($\omega_p - \omega_s$), then the signal phase of each node is basically determined by the transmission line delay.

Two input signals are represented by $x_s^{in}$ and $x_p^{in}$. At the n-th node, the signal with $\omega_s$ coupled to the mixer and input on the s line may be expressed by the equation described below.

$$x_{s,n} = x_s^{in} C_s e^{-j\beta_s \Delta l_s \cdot n}$$

The signal with $\omega_s$ at the same node may be expressed by the equation described below.

$$x_{p,n} = x_p^{in} C_p e^{-j\beta_p \Delta l_p \cdot (N-n)}$$

In the above equations, $x_s^{in}$ denotes an input signal on the s line, $x_p^{in}$ denotes an input signal on the p line, $C_s$ denotes a coupling coefficient of the coupler on the s line, $C_p$ denotes a coupling coefficient of the coupler on the p line, e denotes an natural constant, j denotes an imaginary unit, $\beta_s$ denotes a propagation constant of the input signal $x_s^{in}$ with the frequency $\omega_s$, $\beta_p$ denotes a propagation constant of the input signal $x_p^{in}$ with the frequency $\omega_p$, $\Delta l_s$ denotes a length of the first transmission line, $\Delta l_p$ denotes a length of the second transmission line, and n denotes a sequence number of the n-th mixer at the n-th node, where n=0, 1, 2, ..., (n−1), n, N. Assuming that $\omega_s$ is less than $\omega_p$ and taking the change in the phase difference between two signals into consideration, the respective initial phases are omitted. The phases of two signals at the same node may be expressed by the equations described below.

$$\phi_{s,n} = -\beta_s \Delta l_s n$$

$$\phi_{p,n} = -\beta_p \Delta l_p N + \beta_p \Delta l_p n$$

Two signals serve as the input of the mixer, a component with a frequency of $(\omega_p - \omega_s)$ is generated at the output of the mixer, and the corresponding phase of the component is the phase difference between the two input signals.

$$\phi_{\omega_p-\omega_s} = \phi_{p,n} - \phi_{s,n} = -\beta_p \Delta l_p N + (\beta_p \Delta l_p + \beta_s \Delta l_s) \cdot n$$

Assuming that the transmission lines are dispersion-free, that is, the phase velocities of signals with different frequencies are the same, then the equation described below is satisfied.

$$v_p = \frac{\omega_s}{\beta_s} = \frac{\omega_p}{\beta_p} = \text{constant}$$

The phase of the output signal of the mixer at the n-th node is expressed as below.

$$\phi_{\omega_p-\omega_s} = -\frac{\omega_p \Delta l_p}{v_p} \cdot N + \frac{\omega_p \Delta l_p + \omega_s \Delta l_s}{v_p} \cdot n$$

It is noted that the first term of the preceding equation is a constant, and the second term is proportional to the node number n, so the phase difference between the output signals of two adjacent mixers is expressed as below.

$$\Delta\phi = \frac{\omega_p \Delta l_p + \omega_s \Delta l_s}{v_p}$$

The frequency of the output signal of the mixer is represented by $\omega_{RF}$. The frequencies $\omega_{s0}$ and $\omega_{p0}$ (preset values) of the initial input signals satisfy the equations described below.

$$\omega_{p0} - \omega_{s0} = \omega_{RF}$$

and $$\frac{(\omega_{p0} \Delta l_p + \omega_{s0} \Delta l_s)}{v_p} = 2\pi \cdot m$$

In the equations, m denotes a constant, which is an integer. In the case where the actual frequencies of two input signals are $\omega_{s0}$ and $\omega_{p0}$, $\Delta\phi = 0$, that is, the radio frequency signals output by the mixers have the same phase.

$$\omega_s = \omega_{s0} + \Delta\omega$$

$$\omega_p = \omega_{p0} + \Delta\omega$$

In the case where the preceding equations are satisfied (where $\Delta\omega$ denotes a frequency offset), that is, the difference between frequencies of two input signals remains unchanged and the frequencies of the two input signals increase or decrease by the same amount of frequency at the same time, the phase difference between two adjacent radio frequency output signals is expressed as below.

$$\Delta\phi = \frac{\Delta\omega}{v_p} \cdot (\Delta l_s + \Delta l_p)$$

That is, the frequency of the output signal of each mixer remains unchanged, but the phases increase or decrease by the same amount, and the increment or decrement is proportional to the frequency offset $\Delta\omega$ of the input signal. In this manner, in the present disclosure, the signal frequencies on two transmission lines only need to increase or decrease by the same amount of frequency at the same time so that the control of the radio frequency signal phase can be achieved.

If the lengths of the two transmission lines between nodes are the same, that is, $\Delta l_s = \Delta l_p = \Delta l$, then the phase difference between nodes may be rewritten as the equation described below.

$$\Delta\phi = \frac{\omega_p + \omega_s}{v_p} \Delta l$$

The initial frequencies need to satisfy the equations described below.

$$\omega_{p0} - \omega_{s0} = \omega_{RF}$$

and $$\frac{(\omega_{p0} + \omega_{s0})}{v_p} \Delta l = 2\pi \cdot m$$

The phase difference between two adjacent radio frequency output signals is expressed as below.

$$\Delta\phi = \frac{2\Delta\omega}{v_p} \cdot \Delta l$$

Figure 3:
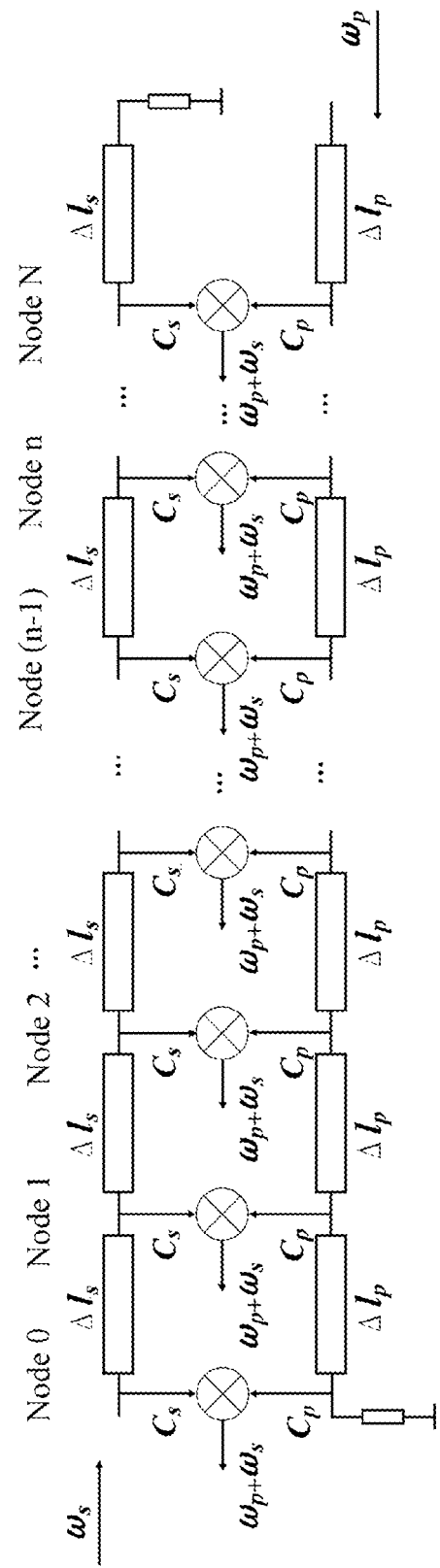
FIG. 3 is a structure diagram of application scenario (2) of the radio frequency phase shifter according to the present disclosure.

(2) In an application scenario (2), it is assumed that the couplers do not have a phase delay, and two input signals are transmitted in reverse directions. In this case, the structure of the radio frequency phase shifter provided in the present disclosure may be equivalent to the structure shown in FIG. 3. The output signal of the mixer retains a sum frequency component $(\omega_p + \omega_s)$, and the other parameter settings are the same as the settings in the application scenario (1) and will not be repeated herein.

Two input signals are represented by $x_s^{in}$ and $x_p^{in}$. At the n-th node, the signal with $\omega_s$ coupled to the mixer and input on the s line may be expressed by the equation described below.

$$x_{s,n} = x_s^{in} C_s e^{-j\beta_s \Delta l_s \cdot n}$$

The signal with $\omega_p$ at the same node may be expressed by the equation described below.

$$x_{p,n} = x_p^{in} C_p e^{-j\beta_p \Delta l_p \cdot (N-n)}$$

In the above equations, $x_s^{in}$ denotes an input signal on the s line, $x_p^{in}$ denotes an input signal on the p line, $C_s$ denotes a coupling coefficient of the coupler on the s line, $C_p$ denotes a coupling coefficient of the coupler on the p line, e denotes an natural constant, j denotes an imaginary unit, $\beta_s$ denotes a propagation constant of the input signal $x_s^{in}$ with the frequency $\omega_s$, $\beta_p$ denotes a propagation constant of the input signal $x_p^{in}$ with the frequency $\omega_p$, $\Delta l_s$ denotes a length of the first transmission line, $\Delta l_p$ denotes a length of the second transmission line, and n denotes a sequence number of the n-th mixer at the n-th node, where n=0, 1, 2, ..., (n−1), n, N. Assuming that $\omega_s$ is less than $\omega_p$ and taking the change in the phase difference between two signals into consideration, the respective initial phases are omitted. The phases of two signals at the same node may be expressed by the equations described below.

$$\phi_{s,n} = -\beta_s \Delta l_s n$$

$$\phi_{p,n} = -\beta_p \Delta l_p N + \beta_p \Delta l_p n$$

Since the output of the mixer is the sum frequency component, the phase of the output signal is expressed as below.

$$\phi_{\omega_p+\omega_s} = \phi_{p,n} + \phi_{s,n} = -\beta_p \Delta l_p N + (\beta_p \Delta l_p - \beta_s \Delta l_s) \cdot n$$

The relationship between the phase gradient and the frequency is expressed as below.

$$\Delta \phi = \frac{\omega_p \Delta l_p - \omega_s \Delta l_s}{v_p}$$

The initial frequencies need to satisfy the equations described below.

$$\omega_{p0} - \omega_{s0} = \omega_{RF}$$

and $$\frac{(\omega_{p0} \Delta l_p + \omega_{s0} \Delta l_s)}{v_p} = 2\pi \cdot m$$

In the equations, m denotes a constant, which is an integer. In the case where the actual frequencies of two input signals are $\omega_{s0}$ and $\omega_{p0}$, $\Delta\phi = 0$, that is, the radio frequency signals output by the mixers have the same phase.

$$\omega_s = \omega_{s0} - \Delta\omega$$

$$\omega_p = \omega_{p0} + \Delta\omega$$

In the case where the preceding equations are satisfied (where $\Delta\omega$ denotes a frequency offset), that is, the sum of the frequencies of two input signals remains unchanged and the frequency of one of the two input signals increases by an amount of frequency and the frequency of the other one of the two input signals decreases by the same amount of frequency at the same time, the phase difference between two adjacent radio frequency output signals is expressed as below.

$$\Delta \phi = \frac{\Delta\omega}{v_p} \cdot (\Delta l_s + \Delta l_p)$$

If the lengths of two transmission lines between nodes are the same, that is, $\Delta l_s = \Delta l_p = \Delta l$, then the phase difference between nodes may be rewritten as the equation described below.

$$\Delta \phi = \frac{\omega_p + \omega_s}{v_p} \Delta l$$

The initial frequencies need to satisfy the equations described below.

$$\omega_{p0} + \omega_{s0} = \omega_{RF}$$

and $$\frac{(\omega_{p0} - \omega_{s0})}{v_p} \Delta l = 2\pi \cdot m$$

The phase difference between two adjacent radio frequency output signals is expressed as below.

$$\Delta \phi = \frac{2\Delta\omega}{v_p} \cdot \Delta l$$

Figure 4:
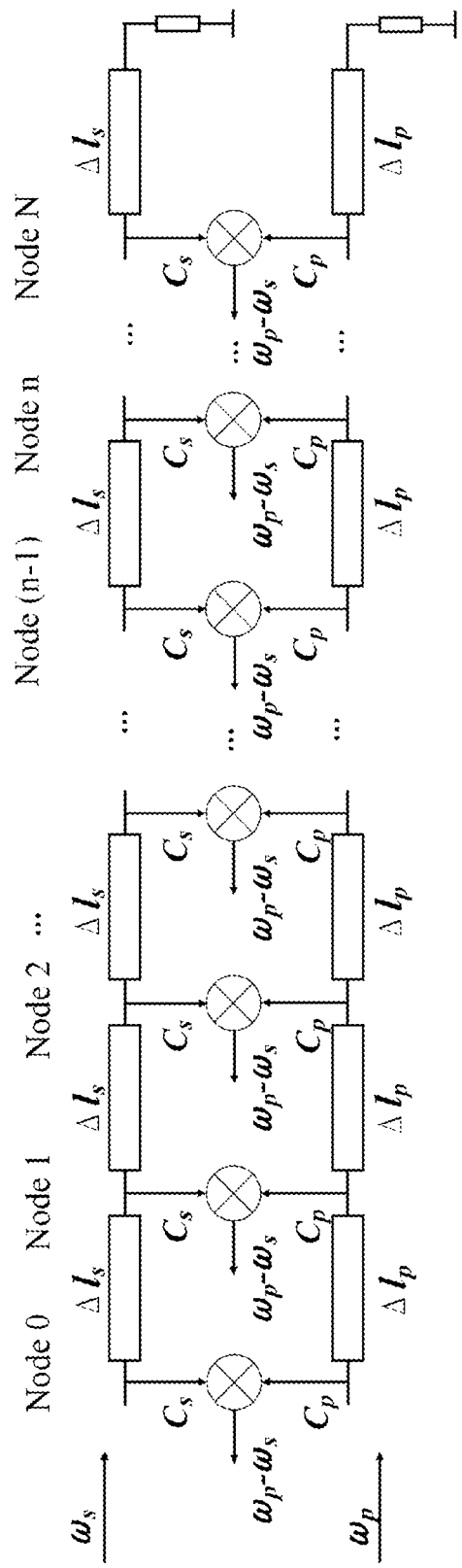
FIG. 4 is a structure diagram of application scenario (3) of the radio frequency phase shifter according to the present disclosure.

(3) In an application scenario (3), it is assumed that the couplers do not have a phase delay, and two input signals are transmitted in the same direction. In this case, the structure of the radio frequency phase shifter provided in the present disclosure may be equivalent to the structure shown in FIG. 4. The output signal of the mixer retains a difference frequency component ($\omega_p - \omega_s$), and the other parameter settings are the same as the settings in the application scenario (1) and will not be repeated herein.

Two input signals are represented by $x_s^{in}$ and $x_p^{in}$. At the n-th node, the signal with $\omega_s$ coupled to the mixer and input on the s line may be expressed by the equation described below.

$$x_{s,n} = x_s^{in} C_s e^{-j\beta_s \Delta l_s \cdot n}$$

The signal with $\omega_p$ at the same node may be expressed by the equation described below.

$$x_{p,n} = X_p^{in} C_p e^{-j\beta_p \Delta l_p \cdot n}$$

In the above equations, $x_s^{in}$ denotes an input signal on the s line, $x_p^{in}$ denotes an input signal on the p line, $C_s$ denotes a coupling coefficient of the coupler on the s line, $C_p$ denotes a coupling coefficient of the coupler on the p line, e denotes an natural constant, j denotes an imaginary unit, $\beta_s$ denotes a propagation constant of the input signal $x_s^{in}$ with the frequency $\omega_s$, $\beta_p$ denotes a propagation constant of the input signal $x_p^{in}$ with the frequency $\omega_p$, $\Delta l_s$ denotes a length of the first transmission line, $\Delta l_p$ denotes a length of the second transmission line, and n denotes a sequence number of the n-th mixer at the n-th node, where n=0, 1, 2, . . . , (n−1), n, N. Assuming that $\omega_s$ is less than $\omega_p$ and taking the change in the phase difference between two signals into consideration, the respective initial phases are omitted. The phases of two signals at the same node may be expressed by the equations described below.

$$\phi_{s,n} = -\beta_s \Delta l_s n$$

$$\phi_{p,n} = -\beta_p \Delta l_p n$$

Since the output of the mixer is the difference frequency component, the phase of the output signal is expressed as below.

$$\phi_{\omega_p - \omega_s} = \phi_{p,n} - \phi_{s,n} = -(\beta_p \Delta l_p - \beta_s \Delta l_s) \cdot n$$

The relationship between the phase gradient and the frequency is expressed as below.

$$\Delta\phi = -\frac{\omega_p \Delta l_p - \omega_s \Delta l_s}{v_p}$$

The initial frequencies need to satisfy the equations described below.

$$\omega_{p0} - \omega_{s0} = \omega_{RF}$$

and $$-\frac{(\omega_{p0}\Delta l_p - \omega_{s0}\Delta l_s)}{v_p} = 2\pi \cdot m$$

In the equations, m denotes a constant, which is an integer. In the case where the actual frequencies of two input signals are $\omega_{s0}$ and $\omega_{p0}$, $\Delta\phi=0$, that is, the radio frequency signals output by the mixers have the same phase.

$$\omega_s = \omega_{s0} + \Delta\omega$$

$$\omega_p = \omega_{p0} + \Delta\omega$$

In the case where the preceding equations are satisfied (where $\Delta\omega$ denotes a frequency offset), that is, the difference between frequencies of two input signals remains unchanged and the frequency of one of the two input signals increases by an amount of frequency and the frequency of the other one of the two input signals decreases by the same amount of frequency at the same time, the phase difference between two adjacent radio frequency output signals is expressed as below.

$$\Delta\phi = \frac{\Delta\omega}{v_p} \cdot (\Delta l_s - \Delta l_p)$$

If the lengths of two transmission lines between nodes are the same, that is, $\Delta l_s = \Delta l_p = \Delta l$, then the phase difference between nodes may be rewritten as the equation described below.

$$\Delta\phi = 0$$

In this manner, the phase shift cannot be achieved. Therefore, in the case of performing transmission in the same direction and using the difference frequency component as the output of the mixer, it is required that the lengths of the delay lines of the two transmission lines are different.

Figure 5:
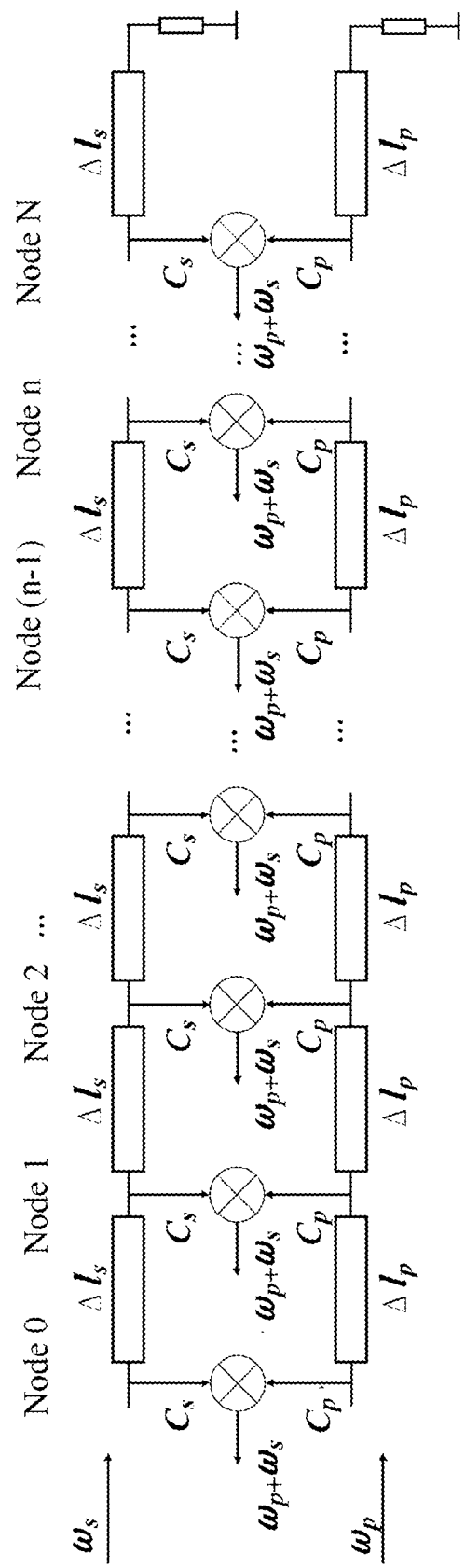
FIG. 5 is a structure diagram of application scenario (4) of the radio frequency phase shifter according to the present disclosure.

(4) In an application scenario (4), it is assumed that the couplers do not have a phase delay, and two input signals are transmitted in the same direction. In this case, the structure of the radio frequency phase shifter provided in the present disclosure may be equivalent to the structure shown in FIG. 5. The output signal of the mixer retains a sum frequency component ($\omega_p + \omega_s$), and the other parameter settings are the same as the settings in the application scenario (1) and will not be repeated herein.

Two input signals are represented by $x_s^{in}$ and $x_p^{in}$. At the n-th node, the signal with $\omega_s$ coupled to the mixer and input on the s line may be expressed by the equation described below.

$$x_{s,n} = x_s^{in} C_s e^{-j\beta_s \Delta l_s \cdot n}$$

The signal with $\omega_p$ at the same node may be expressed by the equation described below.

$$x_{p,n} = x_p^{in} C_p e^{-j\beta_p \Delta l_p \cdot n}$$

In the above equations, $x_s^{in}$ denotes an input signal on the s line, $x_p^{in}$ denotes an input signal on the p line, $C_s$ denotes a coupling coefficient of the coupler on the s line, $C_p$ denotes a coupling coefficient of the coupler on the p line, e denotes an natural constant, j denotes an imaginary unit, $\beta_s$ denotes a propagation constant of the input signal $x_s^{in}$ with the frequency $\omega_s$, $\beta_p$ denotes a propagation constant of the input signal $x_p^{in}$ with the frequency $\omega_p$, $\Delta l_p$ denotes a length of the first transmission line, $\Delta l_p$ denotes a length of the second transmission line, and n denotes a sequence number of the n-th mixer at the n-th node, where n=0, 1, 2, ..., (n−1), n, N. Assuming that $\omega_s$ is less than $\omega_p$ and taking the change in the phase difference between two signals into consideration, the respective initial phases are omitted. The phases of two signals at the same node may be expressed by the equations described below.

$$\phi_{s,n} = -\beta_s \Delta l_s n$$

$$\phi_{p,n} = -\beta_p \Delta l_p n$$

Since the output of the mixer is the sum frequency component, the phase of the output signal is expressed as below.

$$\phi_{\omega_p + \omega_s} = \phi_{p,n} + \phi_{s,n} = -(\beta_p \Delta l_p + \beta_s \Delta l_s) \cdot n$$

The relationship between the phase gradient and the frequency is expressed as below.

$$\Delta\phi = -\frac{\omega_p \Delta l_p + \omega_s \Delta l_s}{v_p}$$

The initial frequencies need to satisfy the equations described below.

$$\omega_{p0} + \omega_{s0} = \omega_{RF}$$

and $$-\frac{(\omega_{p0}\Delta l_p + \omega_{s0}\Delta l_s)}{v_p} = 2\pi \cdot m$$

In the equations, m denotes a constant, which is an integer. In the case where the actual frequencies of two input signals are $\omega_{s0}$ and $\omega_{p0}$, $\Delta\phi=0$, that is, the radio frequency signals output by the mixers have the same phase.

$$\omega_s = \omega_{s0} - \Delta\omega$$

$$\omega_p = \omega_{p0} + \Delta\omega$$

In the case where the preceding equations are satisfied (where $\Delta\omega$ denotes a frequency offset), that is, the sum of frequencies of two input signals remains unchanged and the frequency of one of the two input signals increases by an amount of frequency and the frequency of the other one of the two input signals decreases by the same amount of frequency at the same time, the phase difference between two adjacent radio frequency output signals is expressed as below.

$$\Delta\phi = \frac{\Delta\omega}{v_p} \cdot (\Delta l_s - \Delta l_p)$$

If the lengths of two transmission lines between nodes are the same, that is, $\Delta l_s = \Delta l_p = \Delta l$, then the phase difference between nodes may be rewritten as the equation described below.

$$\Delta\phi = 0$$

In this way, the phase shift cannot be achieved. Therefore, in the case of performing transmission in the same direction and using the sum frequency component as the output of the mixer, it is required that the lengths of the delay lines of the two transmission lines are different.

Figure 6:
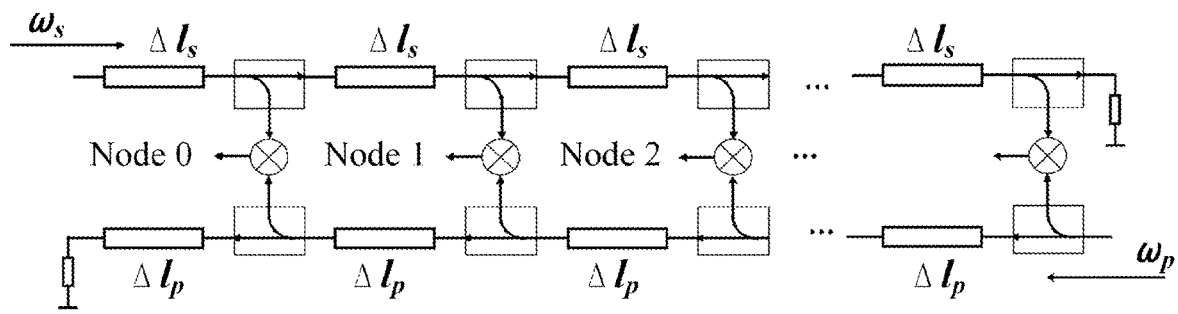
FIG. 6 is a structure diagram of application scenario (5) of the radio frequency phase shifter according to the present disclosure.

(5) In an application scenario (5), it is assumed that the couplers (that is, microwave couplers) have a phase delay, and two input signals are transmitted in reverse directions. In this case, the structure of the radio frequency phase shifter provided in the present disclosure may be equivalent to the structure shown in FIG. 6. The output signal of the mixer retains a difference frequency component ($\omega_p - \omega_s$), and the other parameter settings are the same as the settings in the application scenario (1) and will not be repeated herein.

Figure 7:
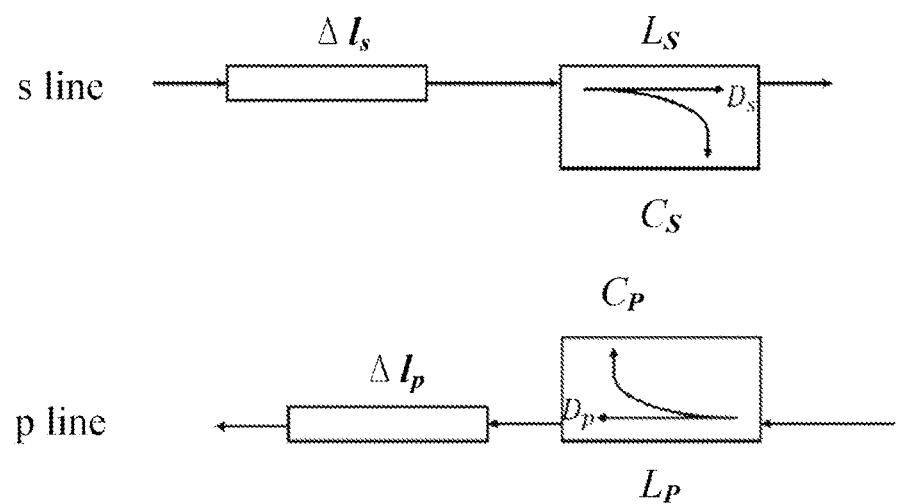
FIG. 7 is an equivalent diagram of a microwave coupler in a transmission line.

The coupler is between two nodes. FIG. 7 shows a structure diagram of two transmission lines in one unit, in which a coupler and a delay line are included. For an input signal with a frequency $\omega_s$, the coupling coefficient of the coupler is expressed as below.

$$C_s = A_s^c e^{-j(\beta_s^c L_s + \theta_s^c)}$$

The coefficient of the through port is expressed as below.

$$D_s = A_s^d e^{-j(\beta_s^d L_s + \theta_s^d)}$$

In the equation, $L_s$ is the equivalent length of the coupler on the s line, $A_s^c$ and $A_s^d$ are the attenuation coefficients of the coupled port and the through port respectively and may be considered as constant real numbers, $\beta_s^c$ and $\beta_s^d$ are the propagation constants of the coupled port and the through port respectively and change with the center frequency, $\theta_s^d$ is the phase delay (phase delay offset) of the through port of the coupler on the s line, and $\theta_s^c$ is the phase delay of the coupled port of the coupler on the s line. In the n-th unit (the first transmission line in the n-th section), the signal output by the coupler is expressed as below.

$$x_{s,n} = x_{s,in} \cdot A_s^c e^{-j(\beta_s^c L_s + \theta_s^c)} \cdot (A_s^d)^n e^{-j(\beta_s^d L_s + \beta_s \Delta l_s + \theta_s^d) \cdot n}$$

For an input signal with a frequency $\omega_p$, the coupling coefficient of the coupler is expressed as below.

$$C_p = A_p^c e^{-j(\beta_p^c L_p + \theta_p^c)}$$

The coefficient of the through port is expressed as below.

$$D_p = A_p^d e^{-j(\beta_p^d L_p + \theta_p^d)}$$

Similarly, the equation described below may be obtained.

$$x_{p,n} = x_{p,in} \cdot A_p^c e^{-j(\beta_p^c L_p + \theta_p^c)} \cdot (A_p^d)^n e^{-j(\beta_p^d L_p + \beta_p \Delta l_p + \theta_p^d) \cdot (N-n)}$$

In the equation, $L_p$ is the equivalent length of the coupler on the p line, $A_p^c$ and $A_p^d$ are the attenuation coefficients of the coupled port and the through port respectively and may be considered as constant real numbers, $\beta_p^c$ and $\beta_p^d$ are the propagation constants of the coupled port and the through port respectively and change with the center frequency, $\theta_p^d$ is the phase delay of the through port of the coupler on the p line, and $\theta_p^c$ is the phase delay of the coupled port of the coupler on the p line.

In the case where the output frequency is a difference frequency component and two signals are transmitted in opposite directions, the phase of the signal coupled to the mixer on the s line at the n-th node is expressed as below.

$$\phi_{s,n} = -(\beta_s^c L_s + \theta_s^c) - n \cdot (\beta_s^d L_s + \beta_s \Delta l_s + \theta_s^d)$$

The phase of the signal coupled to the mixer on the p line is expressed as below.

$$\phi_{p,n} = -(\beta_p^c L_p + \theta_p^c) - (N-n) \cdot (\beta_p^d L_p + \beta_p \Delta l_p + \theta_p^d)$$

In this case, the phase difference between the output signals of two adjacent nodes may be expressed by in the equation described below.

$$\phi_n = \phi_{p,n} - \phi_{s,n} = (\beta_s^d L_s + \beta_s \Delta l_s + \beta_p^d L_p + \beta_p \Delta l_p + \theta_s^d + \theta_p^d) \cdot n + \Phi$$

Similarly, assuming that the structure is dispersion-free and considering that different structural parts may have different phase velocities, the relationship between the frequency and the propagation constant is expressed as below.

$$\beta_s = \frac{\omega_s}{v_p}$$

$$\beta_s^d = \frac{\omega_s}{v_s^d}$$

$$\beta_p = \frac{\omega_p}{v_p}$$

$$\beta_p^d = \frac{\omega_p}{v_p^d}$$

$\Phi$ is a constant and is similar to that in the application scenario (1).

$$\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) + \theta_s + \theta_p = 2\pi \cdot m$$

$$\omega_{p0} - \omega_{s0} = \omega_{RF}$$

For the initial frequencies $\omega_{s0}$ and $\omega_{p0}$, if the preceding equations are satisfied, the nodes are in the same phase in this case.

$$\omega_s = \omega_{s0} + \Delta\omega$$

$$\omega_p = \omega_{p0} + \Delta\omega$$

In the case where the frequency shift occurs, that is, the preceding equations are satisfied (where $\Delta\omega$ denotes a frequency offset), the frequency gradient may also be changed by changing the input frequency, and the relationship between the phase gradient and the frequency variation may be written by the equation described below.

$$\Delta\phi = \Delta\omega \cdot \left(\frac{L_s}{v_s^d} + \frac{\Delta l_s}{v_p} + \frac{L_p}{v_p^d} + \frac{\Delta l_p}{v_p}\right)$$

In the equation, $v_s^d$ is the equivalent phase velocity of the input signal in the coupler on the s line, and $v_p^d$ is the equivalent phase velocity of the input signal in the coupler on the p line. Refer to the application scenario (1) for the description of the parameters in the preceding equation, which will not be repeated in this scenario and the following scenarios.

(6) In an application scenario (6), it is assumed that the couplers (that is, microwave couplers) have a phase delay, and two input signals are transmitted in reverse directions. The output signal of the mixer retains a sum frequency component ($\omega_p+\omega_d$), and the other parameter settings are the same as the settings in the application scenario (1) and will not be repeated herein.

Similarly to the derivation process of the application scenario (5) and referring to the application scenario (2), the phase gradient in the application scenario (6) is expressed as below.

$$\Delta \phi = \Delta \omega \cdot \left( \frac{L_s}{v_s^d} + \frac{\Delta l_s}{v_p} + \frac{L_p}{v_p^d} + \frac{\Delta l_p}{v_p} \right)$$

In the equation, $\Delta\omega$ denotes a frequency offset, $v_s^d$ is the equivalent phase velocity of the input signal in the coupler on the s line, $v_p^d$ is the equivalent phase velocity of the input signal in the coupler on the p line.

The frequencies of the two input signals satisfy the conditions described below.

$$\omega_s = \omega_{s0} - \Delta\omega$$
$$\omega_p = \omega_{p0} + \Delta\omega$$
$$\omega_{p0} + \omega_{s0} = \omega_{RF}$$
$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

(7) In an application scenario (7), it is assumed that the couplers (that is, microwave couplers) have a phase delay, and two input signals are transmitted in the same direction. The output signal of the mixer retains a difference frequency component ($\omega_p-\omega_s$), and the other parameter settings are the same as the settings in the application scenario (1) and will not be repeated herein. Similarly to the derivation process of the application scenario (5) and referring to the application scenario (3), the phase gradient in the application scenario (7) is expressed as below.

$$\Delta \phi = \Delta \omega \cdot \left( \frac{L_s}{v_s^d} + \frac{\Delta l_s}{v_p} - \frac{L_p}{v_p^d} - \frac{\Delta l_p}{v_p} \right)$$

In the equation, $\Delta\omega$ denotes a frequency offset, $v_s^d$ is the equivalent phase velocity of the input signal in the coupler on the s line, $v_p^d$ is the equivalent phase velocity of the input signal in the coupler on the p line.

The frequencies of the two input signals satisfy the conditions described below.

$$\omega_s = \omega_{s0} + \Delta\omega$$
$$\omega_p = \omega_{p0} + \Delta\omega$$
$$\omega_{p0} - \omega_{s0} = \omega_{RF}$$
$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

(8) In an application scenario (8), it is assumed that the couplers (that is, microwave couplers) have a phase delay, and two input signals are transmitted in the same direction. The output signal of the mixer retains a sum frequency component ($\omega_p+\omega_s$), and the other parameter settings are the same as the settings in the application scenario (1) and will not be repeated herein.

Similarly to the derivation process of the application scenario (5) and referring to the application scenario (4). The phase gradient in the application scenario (8) is expressed as below.

$$\Delta \phi = \Delta \omega \cdot \left( \frac{L_s}{v_s^d} + \frac{\Delta l_s}{v_p} - \frac{L_p}{v_p^d} - \frac{\Delta l_p}{v_p} \right)$$

In the equation, $\Delta\omega$ denotes a frequency offset, $v_s^d$ is the equivalent phase velocity of the input signal in the coupler on the s line, $v_p^d$ is the equivalent phase velocity of the input signal in the coupler on the p line.

The frequencies of the two input signals satisfy the conditions described below.

$$\omega_s = \omega_{s0} - \Delta\omega$$
$$\omega_p = \omega_{p0} + \Delta\omega$$
$$\omega_{p0} + \omega_{s0} = \omega_{RF}$$
$$\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) + \theta_s^d + \theta_p^d = 2\pi \cdot m$$

A radio frequency phase shifter provided in the present disclosure is described by using a specific application example below. In practical applications, as shown in FIG. 8, a two-dimensional array can be achieved based on the same principle.

Figure 8:
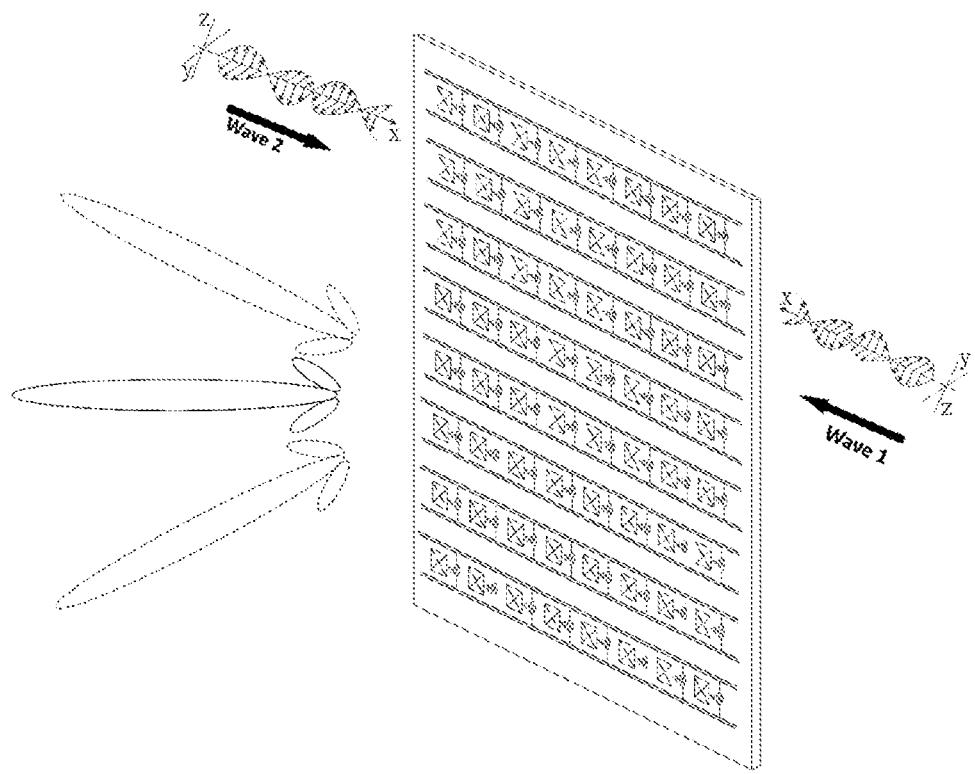
FIG. 8 is a schematic diagram of an application example of the radio frequency phase shifter according to the present disclosure.
Figure 9:
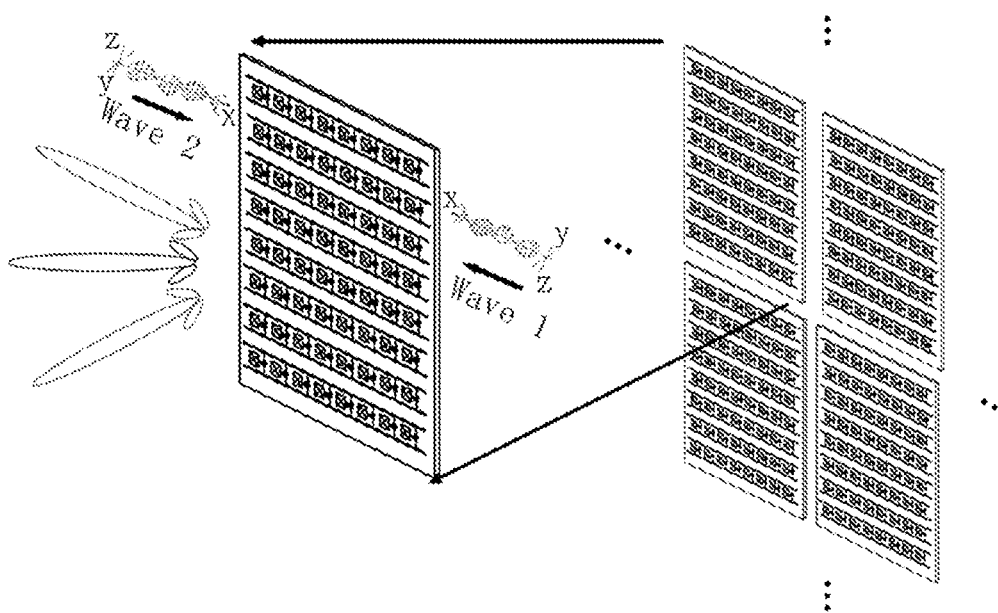
FIG. 9 is another schematic diagram of the application example of the radio frequency phase shifter according to the present disclosure.

FIG. 8 illustrates an 8×8 antenna array. Each row is the structure described above. For example, as shown FIGS. 8 and 9, in this structure, two input signals with different frequencies (i.e., wave 1 and wave 2) are transmitted in reverse directions (i.e., in a X direction), where the X direction, a Y direction and a Z direction are perpendicular to each other. The phases of the signals between different columns may be adjusted by using a conventional phase shifter, or two-dimensional phase control may be achieved by using the technology described in the present disclosure. Further, as shown in FIG. 9, the generated antenna array may be used as a sub-array to form a larger-scale antenna array.

The advantage of the present disclosure is that the structure of the phased array radio frequency front end and the phase control circuit can be greatly simplified. In the traditional phased array, each antenna needs a phase shifter. In this technology, we can completely remove the radio frequency phase shifter or use only a few phase shifters to achieve beam scanning Meanwhile, in this technology, a phase shifter can be achieved by adjusting the frequency. The frequency control circuit can provide the phase control function for arrays of different sizes, that is, the complexity of circuits for achieving the phase shifter function does not change with the increase in the number of array units. Therefore, for super-large-scale arrays, this technology can achieve phase scanning at low cost, largely save circuits, and further improve reliability.

As described above, the preceding embodiments are only used to explain the technical solutions of the present disclosure and not to be construed as limitations thereto; though the present disclosure has been described in detail with reference to the preceding embodiments, those of ordinary skill in the art should understand that modifications can be made on the technical solutions in the preceding embodiments or equivalent substitutions can be made on part of the features therein; and such modifications or substitutions do not make the corresponding technical solutions depart from the spirit and scope of the technical solutions in the embodiments of the present disclosure.

What is claimed is:

1. A radio frequency phase shifter, comprising a plurality of sections of first transmission lines, a plurality of sections of second transmission lines, a plurality of mixers, and a plurality of couplers, wherein each section of the first transmission lines has a same length and each section of the second transmission lines has a same length;

wherein the plurality of sections of first transmission lines are sequentially connected to form a first bus transmission line, the plurality of sections of second transmission lines are sequentially connected to form a second bus transmission line, and the plurality of sections of first transmission lines have a one-to-one correspondence with the plurality of sections of second transmission lines;

a respective one of the plurality of couplers is connected between adjacent ones of the plurality of sections of first transmission lines, a respective one of the plurality of couplers is connected between adjacent ones of the plurality of sections of second transmission lines, and a respective one of the plurality of mixers is connected between two respective ones of the plurality of couplers, so that the plurality of mixers are connected in parallel between the first and second bus transmission lines; and in a case where two input signals with different frequencies are transmitted on the first and second bus transmission lines respectively, the plurality of mixers output a group of signals with a phase gradient, and the phase gradient is changeable by changing the different frequencies of the two input signals, thereby achieving a phase scanning function.

2. The radio frequency phase shifter of claim 1, wherein when the plurality of couplers do not have a phase delay, in a case where the two input signals with different frequencies are transmitted in reverse directions on the first and second bus transmission lines respectively, and a frequency of an output signal of each of the plurality of mixers is a difference frequency component, the phase gradient $\Delta\phi$ is:

$$\Delta\phi = \frac{\Delta\omega}{v_p} \cdot (\Delta l_s + \Delta l_p)$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, and $v_p$ denotes a phase velocity of each of the two input signals in the plurality of sections of first transmission lines and the plurality of sections of second transmission lines, wherein frequencies of the two input signals satisfy the following conditions:

$$\omega_s = \omega_{s0} + \Delta\omega$$
$$\omega_p = \omega_{p0} + \Delta\omega$$
$$\omega_{p0} - \omega_{s0} = \omega_{RF}$$
$$\frac{(\omega_{p0}\Delta l_p + \omega_{s0}\Delta l_s)}{v_p} = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, and m denotes a constant, which is an integer.

3. The radio frequency phase shifter of claim 1, wherein when the plurality of couplers do not have a phase delay, in a case where the two input signals with different frequencies are transmitted in reverse directions on the first and second bus transmission lines respectively, and a frequency of an output signal of each of the plurality of mixers is a sum frequency component, the phase gradient $\Delta\phi$ is:

$$\Delta\phi = \frac{\Delta\omega}{v_p} \cdot (\Delta l_s + \Delta l_p)$$

wherein $\Delta\omega$ denotes a frequency offset, $\Delta l_p$ and $\Delta l_p$ denote a length of each of the plurality of sections of first transmission lines and a length of each of the plurality of sections of second transmission lines respectively, and $v_p$ denotes a phase velocity of each of the two input signals in the plurality of sections of first transmission lines and the plurality of sections of second transmission lines, wherein frequencies of the two input signals satisfy the following conditions:

$$\omega_s = \omega_{s0} - \Delta\omega$$
$$\omega_p = \omega_{p0} + \Delta\omega$$
$$\omega_{p0} + \omega_{s0} = \omega_{RF}$$
$$\frac{(\omega_{p0}\Delta l_p - \omega_{s0}\Delta l_s)}{v_p} = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, and m denotes a constant, which is an integer.

4. The radio frequency phase shifter of claim 1, wherein when the plurality of couplers do not have a phase delay, in a case where the two input signals with different frequencies are transmitted in a same direction on the first and second bus transmission lines respectively, and a frequency of an output signal of each of the plurality of mixers is a difference frequency component, the phase gradient $\Delta\phi$ is:

$$\Delta\phi = \frac{\Delta\omega}{v_p} \cdot (\Delta l_s - \Delta l_p),$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, and $v_p$ denotes a phase velocity of each of the two input signals in the plurality of sections of first transmission lines and the plurality of sections of second transmission lines, wherein frequencies of the two input signals satisfy the following conditions:

$$\omega_s = \omega_{s0} + \Delta\omega$$

$$\omega_p = \omega_{p0} + \Delta\omega$$

$$\omega_{p0} - \omega_{s0} = \omega_{RF}$$

$$-\frac{(\omega_{p0}\Delta l_p - \omega_{s0}\Delta l_s)}{v_p} = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, and m denotes a constant, which is an integer.

5. The radio frequency phase shifter of claim 1, wherein when the plurality of couplers do not have a phase delay, in a case where the two input signals with different frequencies are transmitted in a same direction on the first and second bus transmission lines respectively, and a frequency of an output signal of each of the plurality of mixers is a sum frequency component, the phase gradient $\Delta\phi$ is:

$$\Delta\phi = \frac{\Delta\omega}{v_p} \cdot (\Delta l_s - \Delta l_p)$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, and $v_p$ denotes a phase velocity of each of the two input signals in the plurality of sections of first transmission lines and the plurality of sections of second transmission lines, wherein frequencies of the two input signals satisfy the following conditions:

$$\omega_s = \omega_{s0} - \Delta\omega$$

$$\omega_p = \omega_{p0} + \Delta\omega$$

$$\omega_{p0} + \omega_{s0} = \omega_{RF}$$

$$-\frac{(\omega_{p0}\Delta l_p + \omega_{s0}\Delta l_s)}{v_p} = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, and m denotes a constant, which is an integer.

6. The radio frequency phase shifter of claim 1, wherein when the plurality of couplers have a phase delay, in a case where the two input signals with different frequencies are transmitted in reverse directions on the first and second bus transmission lines respectively, and a frequency of an output signal of each of the plurality of mixers is a difference frequency component, the phase gradient $\Delta\phi$ is:

$$\Delta\phi = \Delta\omega \cdot \left(\frac{L_s}{v_s^d} + \frac{\Delta l_s}{v_p} + \frac{L_p}{v_p^d} + \frac{\Delta l_p}{v_p}\right)$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, $v_p$ denotes a phase velocity of each of the two input signals in the plurality of sections of first transmission lines and the plurality of sections of second transmission lines, $L_s$ denotes an equivalent length of a respective coupler connected to each of the plurality of sections of first transmission lines, $L_p$ denotes an equivalent length of a respective coupler connected to each of the plurality of sections of second transmission lines, $v_s^d$ denotes an equivalent phase velocity of one input signal in the respective coupler connected to each of the plurality of sections of first transmission lines, and $v_p^d$ denotes an equivalent phase velocity of the other input signal in the respective coupler connected to each of the plurality of sections of second transmission lines, wherein frequencies of the two input signals satisfy the following conditions:

$$\omega_s = \omega_{s0} + \Delta\omega$$

$$\omega_p = \omega_{p0} + \Delta\omega$$

$$\omega_{p0} - \omega_{s0} = \omega_{RF}$$

$$\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) + \theta_s^d + \theta_p^d = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, $\theta_s^d$ denotes a phase delay of a through port of the respective coupler connected to each of the plurality of sections of first transmission lines, $\theta_p^d$ denotes a phase delay of a through port of the respective coupler connected to each of the plurality of sections of second transmission lines, and m denotes a constant, which is an integer.

7. The radio frequency phase shifter of claim 1, wherein when the plurality of couplers have a phase delay, in a case where the two input signals with different frequencies are transmitted in reverse directions on the first and second bus transmission lines respectively, and a frequency of an output signal of each of the plurality of mixers is a sum frequency component, the phase gradient $\Delta\phi$ is:

$$\Delta\phi = \Delta\omega \cdot \left(\frac{L_s}{v_s^d} + \frac{\Delta l_s}{v_p} + \frac{L_p}{v_p^d} + \frac{\Delta l_p}{v_p}\right)$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, $v_p$ denotes a phase velocity of each of the two input signals in the plurality of sections of first transmission lines and the plurality of sections of second transmission lines, $L_s$ denotes an equivalent length of a respective coupler connected to each of the plurality of sections of first transmission lines, $L_p$ denotes an equivalent length of a respective coupler connected to each of the plurality of sections of second transmission lines, $v_s^d$ denotes an equivalent phase velocity of one input signal in the respective coupler connected to each of the plurality of sections of first transmission lines, and $v_p^d$ denotes an equivalent phase velocity of the other input signal in the respective coupler connected to each of the plurality of sections of second transmission lines, wherein frequencies of the two input signals satisfy the following conditions:

$$\omega_s = \omega_{s0} - \Delta\omega$$
$$\omega_p = \omega_{p0} + \Delta\omega$$
$$\omega_{p0} + \omega_{s0} = \omega_{RF}$$
$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, $\theta_s^d$ denotes a phase delay of a through port of the corresponding coupler connected to each of the plurality of sections of first transmission lines, $\theta_p^d$ denotes a phase delay of a through port of the respective coupler connected to each of the plurality of sections of second transmission lines, and m denotes a constant, which is an integer.

8. The radio frequency phase shifter of claim 1, wherein when the plurality of couplers have a phase delay, in a case where the two input signals with different frequencies are transmitted in a same direction on the first and second bus transmission lines respectively, and a frequency of an output signal of each of the plurality of mixers is a difference frequency component, the phase gradient $\Delta\phi$ is:

$$\Delta\phi = \Delta\omega \cdot \left(\frac{L_s}{v_s^d} + \frac{\Delta l_s}{v_p} - \frac{L_p}{v_p^d} - \frac{\Delta l_p}{v_p}\right),$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, $v_p$ denotes a phase velocity of each of the two input signals in the plurality of sections of first transmission lines and the plurality of sections of second transmission lines, $L_s$ denotes an equivalent length of a respective coupler connected to each of the plurality of sections of first transmission lines, $L_p$ denotes an equivalent length of a respective coupler connected to each of the plurality of sections of second transmission lines, $v_s^d$ denotes an equivalent phase velocity of one input signal in the respective coupler connected to each of the plurality of sections of first transmission lines, and $v_p^d$ denotes an equivalent phase velocity of the other input signal in the respective coupler connected to each of the plurality of sections of second transmission lines, wherein frequencies of the two input signals satisfy the following conditions:

$$\omega_s = \omega_{s0} + \Delta\omega$$
$$\omega_p = \omega_{p0} + \Delta\omega$$
$$\omega_{p0} - \omega_{s0} = \omega_{RF}$$
$$-\omega_{s0}\left(\frac{L_s}{v_s^d} + \frac{\Delta l_s}{v_p}\right) + \omega_{p0}\left(\frac{L_p}{v_p^d} + \frac{\Delta l_p}{v_p}\right) - \theta_s^d + \theta_p^d = 2\pi \cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, $\theta_s^d$ denotes a phase delay of a through port of the respective coupler connected to each of the plurality of sections of first transmission lines, $\theta_p^d$ denotes a phase delay of a through port of the respective coupler connected to each of the plurality of sections of second transmission lines, and m denotes a constant, which is an integer.

9. The radio frequency phase shifter of claim 1, wherein when the plurality of couplers have a phase delay, in a case where the two input signals with different frequencies are transmitted in a same direction on the first and second bus transmission lines respectively, and a frequency of an output signal of each of the plurality of mixers is a sum frequency component, the phase gradient $\Delta\phi$ is:

$$\Delta\phi = \Delta\omega \cdot \left(\frac{L_s}{v_s^d} + \frac{\Delta l_s}{v_p} - \frac{L_p}{v_p^d} - \frac{\Delta l_p}{v_p}\right)$$

wherein $\Delta\omega$ denotes a frequency offset, $\Delta l_s$ and $\Delta l_p$ denote a length of each of the plurality of sections of first transmission lines and a length of each of the plurality of sections of second transmission lines respectively, $v_p$ denotes a phase velocity of each of the two input signals in the plurality of sections of first transmission lines and the plurality of sections of second transmission lines, $L_s$ denotes an equivalent length of a respective coupler connected to each of the plurality of sections of first transmission lines, $L_p$ denotes an equivalent length of a respective coupler connected to each of the plurality of sections of second transmission lines, $v_s^d$ denotes an equivalent phase velocity of one input signal in the respective coupler connected to each of the plurality of sections of first transmission lines, and $v_p^d$ denotes an equivalent phase velocity of the other input signal in the respective coupler connected to each of the plurality of sections of second transmission lines, wherein frequencies of the two input signals satisfy the following conditions:

$$\omega_s = \omega_{s0} - \Delta\omega$$
$$\omega_p = \omega_{p0} + \Delta\omega$$
$$\omega_{p0} + \omega_{s0} = \omega_{RF}$$

-continued
$$\omega_{s0}\left(\frac{L_s}{v_s^d}+\frac{\Delta l_s}{v_P}\right)+\omega_{p0}\left(\frac{L_p}{v_p^d}+\frac{\Delta l_p}{v_P}\right)+\theta_s^d+\theta_p^d=2\pi\cdot m$$

wherein $\omega_p$ and $\omega_s$ denote the frequencies of the two input signals respectively, $\omega_{p0}$ and $\omega_{s0}$ denote two preset frequencies, $\omega_{RF}$ denotes the frequency of the output signal, $\theta_s^d$ denotes a phase delay of a through port of the respective coupler connected to each of the plurality of sections of first transmission lines, $\theta_p^d$ denotes a phase delay of a through port of the respective coupler connected to each of the plurality of sections of second transmission lines, and m denotes a constant, which is an integer.

* * * * *